United States Patent
Bu et al.

(10) Patent No.: US 7,572,716 B2
(45) Date of Patent: Aug. 11, 2009

(54) SEMICONDUCTOR DOPING WITH IMPROVED ACTIVATION

(75) Inventors: Haowen Bu, Plano, TX (US); Shashank S. Ekbote, Allen, TX (US); Borna Obradovic, McKinney, TX (US); Srinivasan Chakravarthi, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 11/739,981

(22) Filed: Apr. 25, 2007

(65) Prior Publication Data

US 2008/0268623 A1    Oct. 30, 2008

(51) Int. Cl.
*H01L 21/425* (2006.01)
(52) U.S. Cl. .................. 438/528; 438/519; 438/527; 257/E21.057; 257/E21.147; 257/E21.248
(58) Field of Classification Search .......... 438/519, 438/527, 528; 257/E21.057, 147, 248
See application file for complete search history.

(56) References Cited

U.S. PATENT DOCUMENTS

2004/0235280 A1* 11/2004 Keys et al. ............ 438/528

2006/0160338 A1* 7/2006 Graoui et al. ............ 438/527

* cited by examiner

*Primary Examiner*—Charles D. Garber
*Assistant Examiner*—Yasser A Abdelaziez
(74) *Attorney, Agent, or Firm*—Wade J. Brady, III; Frederick J. Telecky, Jr.

(57) ABSTRACT

A method is disclosed for doping a target area of a semiconductor substrate, such as a source or drain region of a transistor, with an electronically active dopant (such as an N-type dopant used to create active areas in NMOS devices, or a P-type dopant used to create active areas in PMOS devices) having a well-controlled placement profile and strong activation. The method comprises placing a carbon-containing diffusion suppressant in the target area at approximately 50% of the concentration of the dopant, and activating the dopant by an approximately 1,040 degree Celsius thermal anneal. In many cases, a thermal anneal at such a high temperature induces excessive diffusion of the dopant out of the target area, but this relative concentration of carbon produces a heretofore unexpected reduction in dopant diffusion during such a high-temperature thermal anneal. The disclosure also pertains to semiconductor components produced in this manner, and various embodiments and improvements of such methods for producing such components.

20 Claims, 5 Drawing Sheets

$$J = -D \frac{\partial \phi}{\partial x}$$

$$\frac{\partial \phi}{\partial t} = D \frac{\partial^2 \phi}{\partial x^2}$$

$$D = D_0 * e^{-\frac{E_A}{R*T}}$$

SEMICONDUCTOR DOPING WITH IMPROVED ACTIVATION

FIELD

The present disclosure relates generally to the field of semiconductor component fabrication. More particularly, the present disclosure relates to the placement of a dopant in a target area of a semiconductor substrate, and the activation of the dopant through a rapid thermal anneal in such a manner as to activate the dopant while also controlling diffusion of the dopant out of a target area.

BACKGROUND

The present disclosure relates generally to the field of semiconductor fabrication. In conventional practice, semiconductor fabrication begins with the provision of a semiconductor wafer, comprising silicon formed in a regular, crystalline structure. A circuit pattern is devised in which regions of the semiconductor wafer are intended to support NMOS and PMOS semiconductor components. These regions are isolated from each other with the formation of electronically inert isolation trenches. Each region is then doped with a type of dopant opposite the electronic nature of the components to be created thereupon. For instance, the dopant may be introduced through ion implantation, in which charged ions of the dopant material are fired at the semiconductor wafer at high speeds, thereby physically injecting them into the substrate. Following doping, electronic components are then formed upon the semiconductor wafer, which typically involves doping (via ion implantation or another suitable method) the electronically active areas of the semiconductor wafer with the desired type of dopant. For instance, NMOS components are formed by placing a p-type dopant in a region of the semiconductor, and then forming the components by placing an n-type dopant in order to create the electronically active regions of the NMOS component. Each dopant is exposed to a thermal anneal, which restores the crystalline lattice structure of the semiconductor wafer (since some physical placement processes, such as ion implantation, can disrupt the crystalline lattice), and also electronically "activates" the dopant ions by positioning them within the same lattice structure. The components may then be connected through a metallization step, in which metal paths are formed to connect the electronically active areas of the components into a fully interconnected circuit.

It will be appreciated that the placement of the dopant is a key step in semiconductor component fabrication. For many semiconductor components, the characteristics of doping, such as the choice of dopant, the placement method, and the resulting concentration and area of the dopant, dopant concentration vertical and lateral gradient, bear critically on the resulting performance and reliability of the components. One scenario that requires precise placement is in the formation of source/drain regions of a MOSFET transistor. A typical transistor comprises two electronically active areas that serve as the source and drain regions of the transistor, which are bridged by a gate. When the gate is powered above a certain threshold voltage, a conductive channel is formed between the source and drain regions to close the circuit; but when the gate is unpowered, the channel resists such electronic flow. In this context, the characteristics of the source/drain region doping relate to the threshold voltage of the gate and the resistance of the channel in powered and unpowered states. If the dopant concentration is too low, or if the source and drain are too distant, the threshold voltage will be undesirably high. If the dopant concentration is too high, or if the source and drain regions are too close, the threshold voltage will be undesirably low, and the resistance in the unpowered state may be insufficient to prevent electron flow.

One challenge that interferes with the precise placement of dopant is the high-temperature thermal anneal. The high temperature is necessary to induce the dopant ions to move into position within the crystalline lattice structure in order to participate in the conductivity of the circuit, which thereby "activates" the dopant. However, the high temperature also promotes diffusion of the dopant material through the solid medium of the semiconductor substrate. Since the dopant is placed at an area of high concentration, diffusion serves to disperse the concentrated dopant ions throughout the undoped adjacent areas of the substrate, thereby creating a broadened, imprecise gradient of doping that compromises the predictability and reliability of the circuit.

The occurrence of thermally induced fusion are well-studied, and are generally presented as a relationship known as Fick's laws of diffusion, shown in FIGS. 1A-1C. FIG. 1A presents Fick's first law of diffusion 10, describing steady-state diffusion, in which J represents diffusion flux, which is equivalent to the rate of net diffusion. This equation 10 demonstrates that diffusion flux is proportional to the constant D, which represents a diffusion coefficient for the substrate. Similarly, FIG. 1B presents Fick's second law of diffusion 12, describing dynamic state diffusion, in which $\partial\phi/\partial t$ represents the change in concentration over time (which, again, is equivalent to the rate of net diffusion.) This equation 12 also demonstrates that the change in concentration over time is proportional to the constant D. Both equations rely on the calculation of the diffusion coefficient, D, which is performed according to the equation presented in FIG. 1C. In this equation 14, the diffusion coefficient is shown to be proportional to T, which represents the temperature of the substrate. Because the diffusion coefficient of a substrate is proportional to its temperature (according to 14), and because the rate of diffusion is proportional to the diffusion coefficient in both steady-state environments (according to 10) and dynamic-state environments (12), it will be evident that, according to Fick's laws, diffusion of a substance (such as a dopant) in a solid substrate is generally proportional to the temperature of the solid substrate. As a result, higher temperature anneals promote dopant diffusion out of a target area in which the dopant was placed, thereby reducing the performance and reliability of the semiconductor component. This prediction is borne out through common observations and practice in the field of art.

At least two methods are known to reduce diffusion of a dopant placed in a semiconductor substrate. First, the temperature of the semiconductor substrate is often kept low to reduce diffusivity, again in keeping with Fick's laws. For instance, the anneal may be performed at a sufficiently high temperature to activate the dopant, but no greater, in order to limit diffusion that deactivates the dopant. The semiconductor fabrication process may be arranged so that, following the placement of the dopant, the substrate is kept below a certain temperature threshold, which, if exceeded, is believed to cause diffusion to exceed manufacturing tolerances.

A second known technique for reducing diffusion is the placement of carbon (or an agent that contains carbon) in the semiconductor substrate, which is known to suppress diffusion of some dopants during thermal annealing. However, the suppressant aspect of carbon as a co-placement with a dopant is not known to alter the proportionalities of Fick's law, but rather restrains the rates of diffusion otherwise predicted thereby.

A related problem with semiconductor doping that will be addressed herein pertains to a physical characteristic of the semiconductor substrate that causes problems with ion implantation placement. Because the substrate comprises a crystalline lattice with a regular structure, some lattice configurations may include longitudinal channels. If a dopant particle placed via ion implantation is fired at the substrate with an angle and position corresponding to a channel, it may deeply penetrate the substrate before coming to rest in a region of the lattice, resulting in undesirably deep penetration. This characteristic of ion implantation may disrupt the tight control of active area doping, and hence the performance and reliability of semiconductors fabricated in this manner.

In light of the foregoing explanation of source/drain regions and the impact of these designs on transistor performance, it will be appreciated that tight control over the dopant diffusion, placement depth, and channeling through longitudinal channels is advantageous for semiconductor manufacturing. Such control is also desirable due to the trend of increasing miniaturization in electronic components, where the demand for increasingly miniaturized semiconductor components calls for greater precision in fabrication techniques. Therefore, it is always desirable to make improvements in the area of semiconductor fabrication.

SUMMARY

The following presents a simplified summary of the disclosure in order to provide a basic understanding of some aspects of the disclosure. This summary is not an extensive overview of the disclosure. It is intended neither to identify key or critical elements of the disclosure nor to delineate the scope of the disclosure. Rather, its primary purpose is merely to present one or more concepts of the disclosure in a simplified form as a prelude to the more detailed description that is presented later.

As discussed hereinabove, the details of thermal activation doping methods can critically affect the performance characteristics of semiconductor components that rely on such techniques. In particular, the temperature to which the semiconductor is exposed, including during the thermal anneal for dopant activation, is known to be generally proportional to the rate of diffusion of a placed dopant, and so is kept comparatively low to reduce undesirable diffusion. For instance, the thermal anneal is often held tightly at 1,000 degrees Celsius, and the temperature of the semiconductor is kept low following the activating thermal anneal.

The present disclosure relates to a heretofore unobserved and unexpected effect in which, for a particular range of concentrations of dopant particles to co-placed carbon atoms, higher temperatures become inversely proportional to dopant diffusion. This thermal diffusion suppressant effect may be utilized to permit higher-temperature anneals that lead to greater activation of the dopant, while holding constant or even reducing the rate of dopant deactivation from temperature-induced diffusion out of the target area. The present disclosure presents data that supports this observation, and suggests fabrication process parameters that invoke this effect for two particular dopants. The disclosure also presents methods of doping areas of a semiconductor substrate, and by extension of forming a semiconductor component, that invoke the thermal diffusion suppressant effect to produce a semiconductor with improved performance. Finally, the present disclosure relates to improvements of these methods that may yield additional advantages.

To the accomplishment of the foregoing and related ends, the following description and annexed drawings set forth in detail certain illustrative aspects and implementations of the disclosure. These are indicative of but a few of the various ways in which one or more aspects of the present disclosure may be employed. Other aspects, advantages and novel features of the disclosure will become apparent from the following detailed description of the disclosure when considered in conjunction with the annexed drawings.

DETAILED DESCRIPTION

Figures 1A, 1B, 1C, 2:
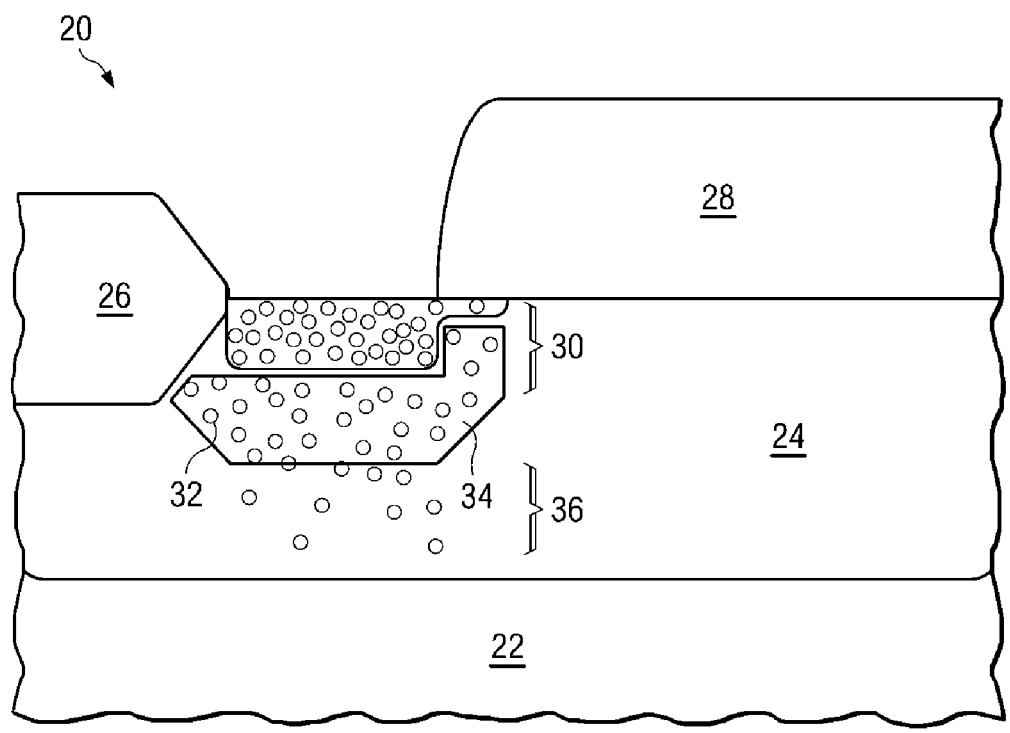
FIGS. 1A-1C are mathematical formulae (known Fick's laws of diffusion) that relate to the present disclosure.
FIG. 2 is a side elevation view in cross-section illustrating a dopant configuration in accordance with the present disclosure.

One or more aspects of the present disclosure are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present disclosure. It may be evident, however, to one skilled in the art that one or more aspects of the present disclosure may be practiced with a lesser degree of these specific details. In other instances, well-known structures and devices are shown in block diagram form in order to facilitate describing one or more aspects of the present disclosure.

As discussed hereinabove, the present disclosure pertains to the effect of temperature to which a semiconductor substrate is exposed during fabrication on the diffusion of a placed dopant through the solid substrate. The rate of such diffusion is generally shown to be proportional to the temperature of the substrate, and so conventional fabrication methods are arranged to minimize the temperature throughout the fabrication process. However, it has been discovered and is herein disclosed that under certain conditions, particularly relating to the presence of carbon, temperature becomes inversely proportional to the extent of dopant diffusion. This thermal diffusion suppressant effect may be utilized to form higher-performance semiconductor devices.

The thermal diffusion suppressant effect may be illustrated by reference to the figures of this disclosure. FIG. 2 represents a typical dopant profile following annealing, and without invocation of the effect disclosed herein. In this figure, the semiconductor component 20 is illustrated comprising (in part) a silicon wafer 22 where a semiconductor device, such as a MOS transistor, is intended to be formed on the upper layer that will serve as the semiconductor substrate 24. The semiconductor substrate is often doped with the opposite type of dopant in order to provide electronic isolation of the components thereupon; however, other arrangements may also be suitable, such as when the substrate hosts an electronically active "pocket" region having the same electronic property but an increased dopant concentration. The electronically active region of the semiconductor substrate 24 may be isolated from other areas of the semiconductor by the use of an isolation structure 26, such as a localized oxidation of silicon (LOCOS) isolation structure or an isolation trench. This figure illustrates a portion of a transistor, where a gate 28 connects a target area 30 with another active area (not shown.) The target area 30 is intended to function as an active area of the transistor, e.g., the source or drain region, and is rendered conductive by placing a dopant 32 in the target area 30 and activating it. However, due to channeling and diffusion, the actual placement profile of the dopant 32 does not match the profile of the target area 30. The target area 30 contains a high concentration of dopant, but the dopant 32 has also diffused out of the target region 30 both laterally and longitudinally into the surrounding area 34 of the semiconductor substrate 24. Additionally, the dopant 32 has deeply penetrated the target area 30 not only at a medium depth such as within the diffusion area 34, but also into a deeper area 26 of the semiconductor substrate 24 due to channeling through the substrate lattice. As used herein, the area 30 of the semiconductor 20 where the dopant 32 is intended to be placed will be described as the "target area"; the area 34 where diffusion occurs will be described as the "diffusion area"; and the area 36 where placement occurs at a relatively great depth due to channeling in an ion implantation placement will be describe as the "channeling area." Due to the problems of channeling and diffusion during heat-induced annealing, the dopant 32 in this conventional embodiment has diffused out of the target area 30 into the diffusion area 34, and has also penetrated the semiconductor substrate 24 into the channeling area 36.

Figure 3A:
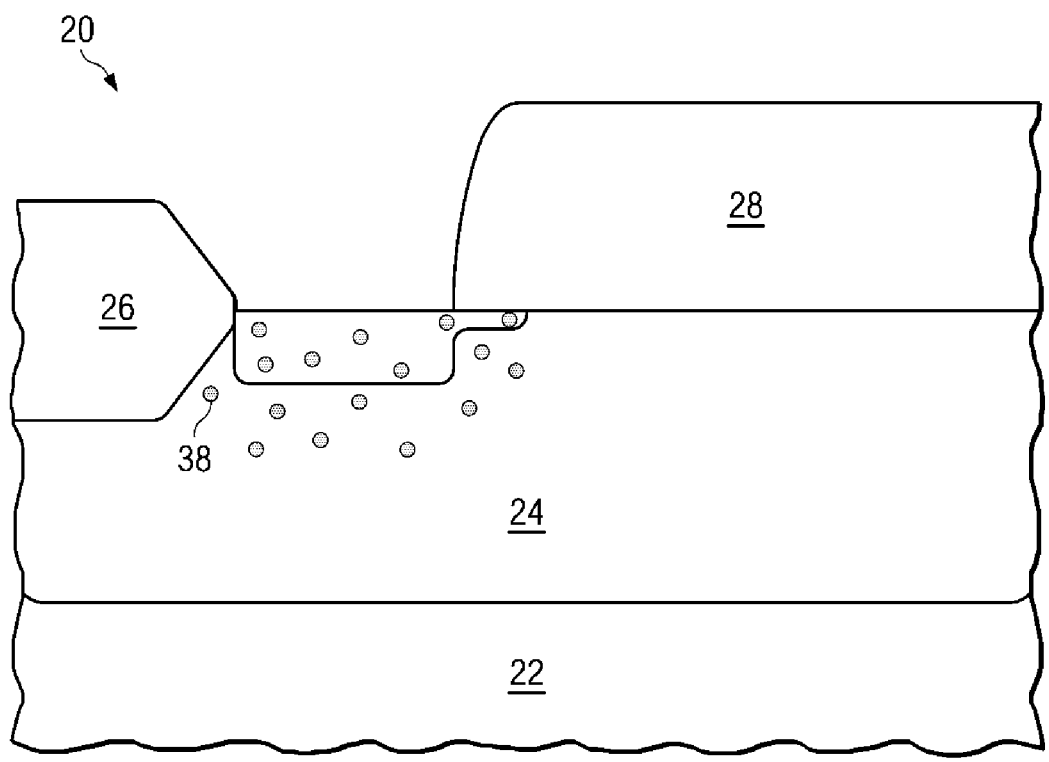
FIGS. 3A-3B are a set of side elevation views in cross-section that together illustrate a dopant configuration in accordance with the present disclosure.
Figure 3B:
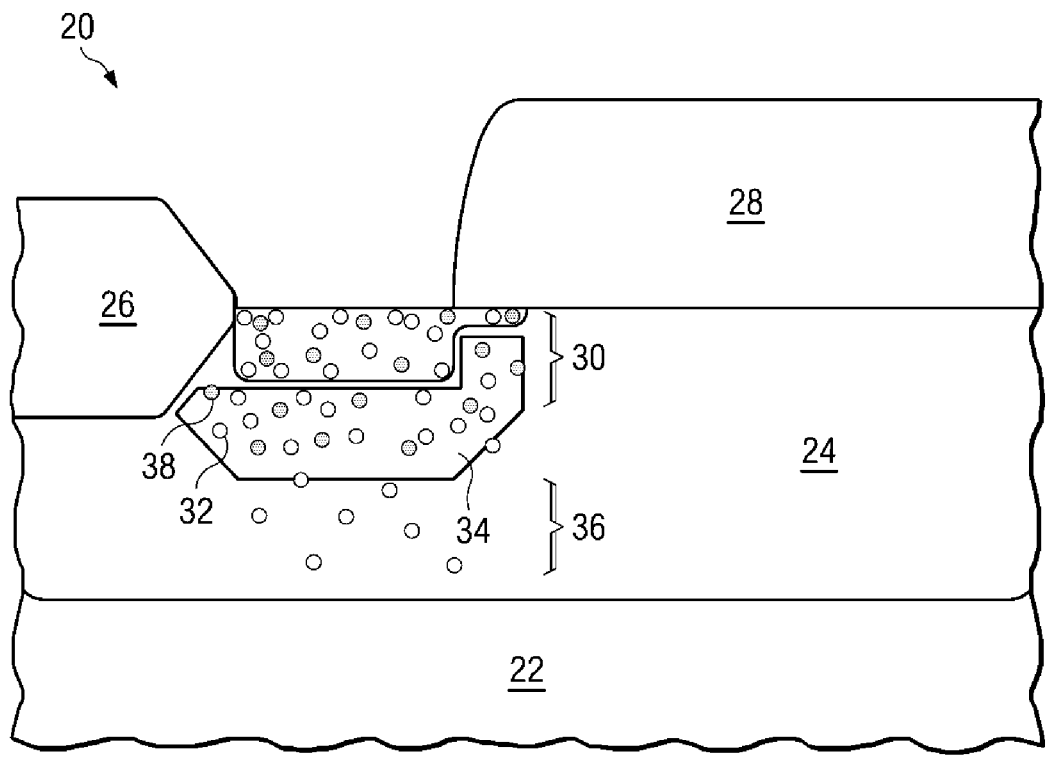

By contrast, FIGS. 3A-B illustrate an embodiment having a more desirable dopant profile through utilization of the thermal diffusion suppressant effect, as described in the present disclosure. These figures again illustrate a MOS semiconductor component 20 comprising (in part) a silicon wafer 22 having a semiconductor substrate 24, which may be isolated from neighboring electronically active areas via an isolation structure 26, and on which is to be formed a gate 28 bridging a target area 30 with another active area (not shown.) In this embodiment, the method of doping a target area on a semiconductor substrate comprises placing a dopant in the target area, and placing carbon in the target area at a concentration with respect to the dopant that invokes the reduced thermal diffusion effect described herein. FIG. 3A shows the introduction of carbon 38, and its concentration as compared with the concentration of the dopant 32, that will cause the target area to retain more of the dopant 32 and will reduce diffusion of the dopant particles 32 into the diffusion area 34. A comparison between FIGS. 2 and 3B demonstrates that while the dopant may (or may not) still be present in the channeling area 36, the amount of dopant that diffuses out of the target area 30, both laterally and longitudinally, into the diffusion area 34 is reduced. After placing the dopant 32 and the carbon 38 in the target area 30, the semiconductor substrate is subjected to a high-temperature anneal, where the temperature is elevated (with respect to conventional high-temperature anneal processes) in order to take advantage of the thermal diffusion suppressant effect described herein. The diffusion of dopant during thermal annealing will thereby be reduced.

Figure 4A:
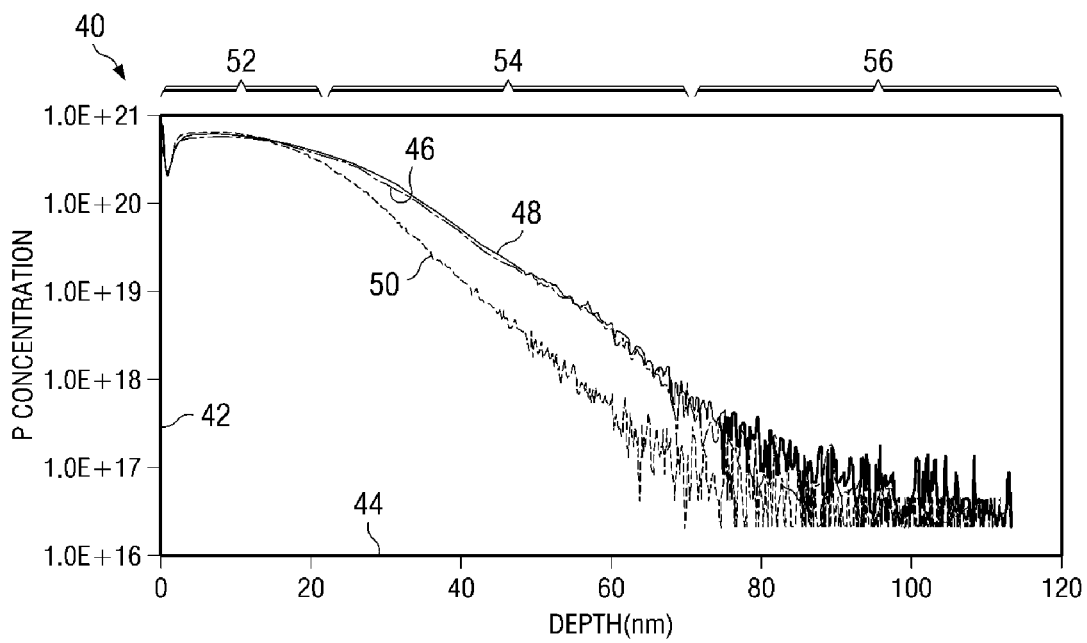
FIGS. 4A-4B are charts illustrating some advantages of placement techniques in accordance with the present disclosure.
Figure 4B:
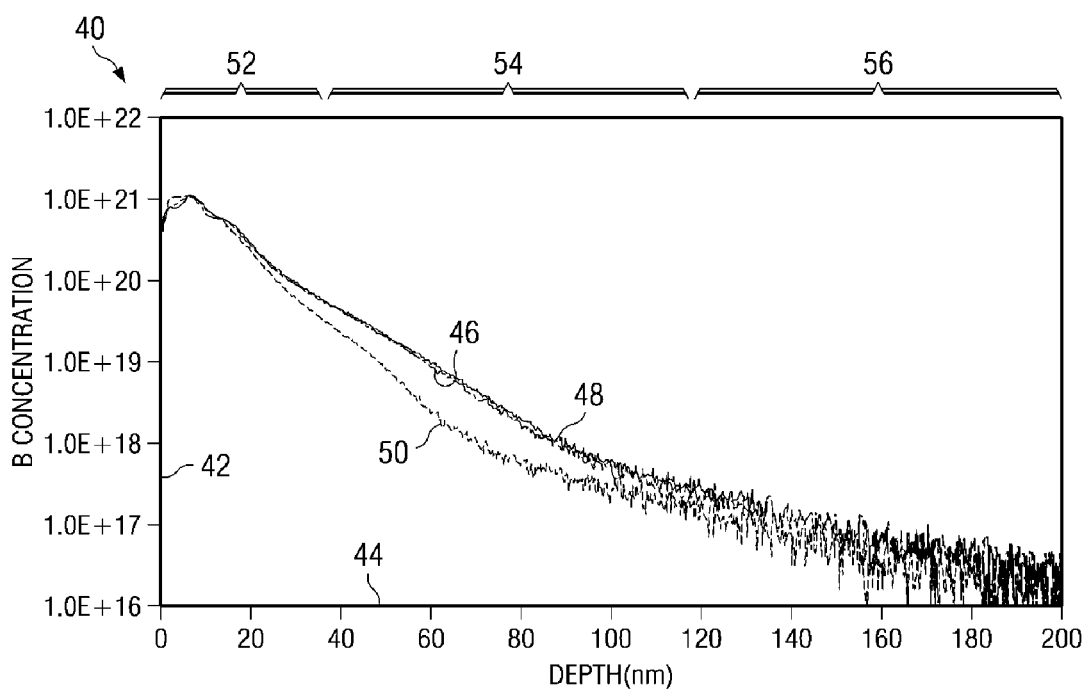
Figure 5:
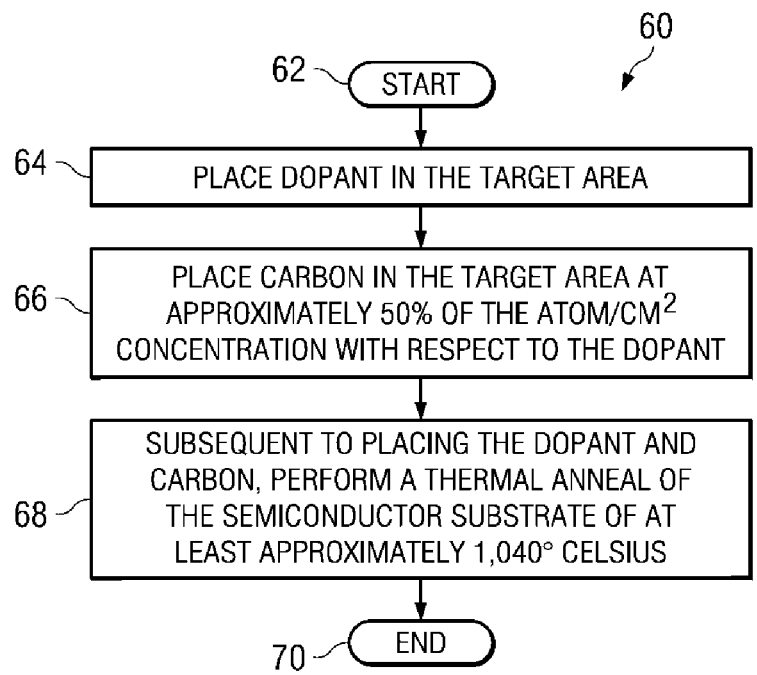
FIG. 5 is a flow diagram illustrating an exemplary method of placing a dopant in accordance with the present disclosure.

The thermal diffusion suppressant effect is supported by evidence provided in FIGS. 4A-B, each of which depicts measurements of the concentration at various depths of a dopant placed in a target area, and which illustrates the variances in such measurements in light of alternative placement methods. FIG. 4A is a chart 40 depicting the concentration of a phosphorus dopant, which is frequently used as an n-type dopant in the source and/or drain regions of an NMOS component. In this chart 40, the vertical axis 42 depicts dopant concentration (on a logarithmic scale), while the horizontal axis 44 depicts the substrate depth at which the measurement is taken. The chart 40 contrasts three dopant profiles, each of which involved the placement of phosphorus in the target area via ion implantation at 3 keV and with a concentration of $2 \times 10^{15}$ atoms/cm$^2$, and carbon placed in the target area via ion implantation at 4 keV and with a concentration of $1 \times 10^{15}$ atoms/cm$^2$. It will be appreciated that the carbon concentration for these cases is 50% of the concentration in atoms/cm$^2$ in relation to the concentration of the dopant. The three cases tested and presented in FIG. 4A include the aforementioned implantations followed by a rapid thermal anneal at various temperatures: one series 46 involving an anneal at 1,000° C.; another series 48 involving an anneal at 1,020° C.; and another series 50 involving a thermal anneal at 1,040° C. (The data points for the comparatively low-temperature anneal 46 and the mid-temperature anneal 48 may not be distinct because the results were very similar.) It will be apparent from FIG. 4A that all three processes produced a similar concentration of phosphorus in the upper region of the substrate 52, which comprises the target area, and a similar concentration of phosphorus in the deepest region of the substrate 56. However, a significant gap exists in the middle region 54, in which the highest temperature thermal anneal 50 produced a sharper gradient of dopant concentration between the shallowest area representing the target area 52 and the portion of the substrate below the target area 54, while the comparatively low-temperature anneal 46 and the mid-temperature anneal 48 produced very similar, and undesirably high, level of diffusion out of the target area. This demonstrates that in the presence of carbon at the tested ratio (approximately 50% concentration of carbon to phosphorus), an anneal of 1,040° C. provided enhanced suppression of dopant diffusion than lower-temperature anneals, contrary to Fick's laws of diffusion.

Similarly, FIG. 4B is a chart 40 depicting the concentration of a boron dopant, which is frequently used as a p-type dopant in the source and/or drain regions of an PMOS component. Again, in this chart 40, the vertical axis 42 depicts dopant concentration (on a logarithmic scale), while the horizontal axis 44 depicts the substrate depth at which the measurement is taken. Like the chart discussed hereinabove, the chart 40 in FIG. 4B contrasts three dopant profiles, each of which involved the placement of boron in the target area via ion implantation at 2 keV and with a concentration of $2 \times 10^{15}$ atoms/cm$^2$, and carbon placed in the target area via ion implantation at 4 keV and with a concentration of $1 \times 10^{15}$ atoms/cm$^2$. It will again be appreciated that the carbon concentration for these cases is 50% of the concentration in atoms/cm$^2$ in relation to the concentration of the dopant. As before, the three cases tested and presented in FIG. 4B include the aforementioned implantations followed by a rapid thermal anneal at various temperatures: one series 46 involving an anneal at 1,000° C.; another series 48 involving an anneal at 1,020° C.; and another series 50 involving a thermal anneal at 1,040° C. It will be apparent from FIG. 4B that all three processes produced a similar concentration of boron in the upper region of the substrate 52, which comprises the target area, and a similar concentration of boron in the deepest region of the substrate 56. However, mirroring the results of FIG. 4A, a significant gap exists in the middle region 54, in which the highest temperature thermal anneal 50 produced a sharper gradient of dopant concentration between the shallowest area representing the target area 52 and the portion of the substrate below the target area 54, while the comparatively low-temperature anneal 46 and the mid-temperature anneal 48 produced very similar, and undesirably high, level of diffusion out of the target area. This again demonstrates that in the presence of carbon at the tested ratio (approximately 50% concentration of carbon to boron), an anneal of 1,040° C. provided enhanced suppression of dopant diffusion than lower-temperature anneals, contrary to Fick's laws of diffusion.

Because the thermal diffusion suppressant effect is newly observed and described herein, the physical mechanisms that produce this effect are not fully and definitively understood. While the present disclosure and suggested embodiments are not limited to any particular theory or cause of this effect, one theory that is supported by the data presented herein is hereby submitted. It is observed that the rapid thermal anneal typically comprises a very fast temperature spike, where the semiconductor substrate is very briefly (e.g., for a period of several milliseconds) exposed to a heat source that raises its temperature very quickly, and is then permitted to cool very quickly. As described hereinabove, this heating serves to activate both the dopant and the co-placed carbon atoms by moving these particles into the crystalline lattice structure, while also inducing diffusion of the dopant out of the target area. One explanation of the thermal diffusion suppressant effect consistent with this model is based on an assertion that the diffusion occurs throughout this heating process, while the activation occurs very quickly and early in this process (such as in the first few instances.) Since the suppressant effect of the carbon is maximized when the carbon is activated, it may be that the parameter ranges in which the thermal diffusion suppressant effect are observed—i.e., a comparatively high temperature, and a comparatively high concentration of carbon with respect to dopant—result in a quicker and more thorough activation of diffusion-suppressing carbon very early in the thermal spike. As the thermal anneal progresses, the more thoroughly activated carbon produces an enhanced diffusion suppressant effect. Therefore, the diffusion-enhancing effects of the higher temperature may be offset and exceeded by the diffusion-suppressant effects of the more thoroughly activated diffusion-suppressing carbon. However, this theory is tendered as one possible explanation for the thermal diffusion suppressant effect, and the present disclosure is not limited to invocations of the thermal diffusion suppressant effect that are consistent with this theory.

Having described and supported the thermal diffusion suppressant effect, some methods of utilizing the effect, and some components produced with reliance on this effect, will now be described.

A method in accordance with the present disclosure is illustrated in FIG. 4, which utilizes the thermal diffusion suppressant effect in the fabrication of a semiconductor substrate with an electronically activated target area. In this figure, the method 60 begins at 62 and calls for placing a dopant in the target area 64. The method then involves placing carbon in the target area at approximately 50% of the atom/cm$^2$ concentration with respect to the dopant 66. It will be appreciated that the dopant and carbon may be placed in either order, or even simultaneously, in keeping with the present disclosure. Subsequent to placing the dopant and the carbon, the method involves performing a thermal anneal of the semiconductor substrate of at least approximately 1,040° Celsius 68, at which point the method ends at 70. It will be appreciated that the thermal anneal 68 serves to activate the carbon and the dopant. Moreover, this method calls for a carbon co-placement concentration and a comparatively high-temperature anneal that together invoke the thermal diffusion suppressant effect, in accordance with the present disclosure and illustrations of FIGS. 2-3.

Some embodiments of this method in accordance with the present disclosure will now be disclosed. In one set of embodiments, phosphorus can be selected as a dopant and used in this method in order to achieve the foregoing advantages. For instance, phosphorus may be used in order to form n-type source/drain regions in an NMOS component. In one subset of embodiments, phosphorus may be placed by ion implantation of at least approximately 3 keV and with a dosage of at least approximately $2\times10^{15}$ atoms/cm$^2$, while carbon may also be placed by ion implantation of at least approximately 4 keV and with a dosage of at least approximately $1\times10^{15}$ atoms/cm$^2$. These placement parameters will produce the effect illustrated in FIG. 4A. In another set of embodiments, boron can be selected as a dopant and used in this method in order to achieve the foregoing advantages. For instance, boron may be used in order to form p-type source/drain regions in a PMOS component. In one subset of embodiments, boron may be placed by ion implantation of at least approximately 2 keV and with a dosage of at least approximately $2\times10^{15}$ atoms/cm$^2$, and carbon may also be placed by ion implantation of at least approximately 4 keV and with a dosage of at least approximately 1×1015 atoms/cm2. These placement parameters will produce the effect illustrated in FIG. 4B.

The method described hereinabove may use any of several components to perform the thermal anneal. In one set of embodiments, a laser is used to heat the semiconductor substrate. In another set of embodiments, a flash lamp is used. In yet another set of embodiments, an arc lamp is used. It will be appreciated by those having ordinary skill in the art that many methods and components for performing the thermal anneal are available and may be suitable, and that any such suitable technique for performing the thermal anneal may be in accordance with the present disclosure.

Figure 6A:
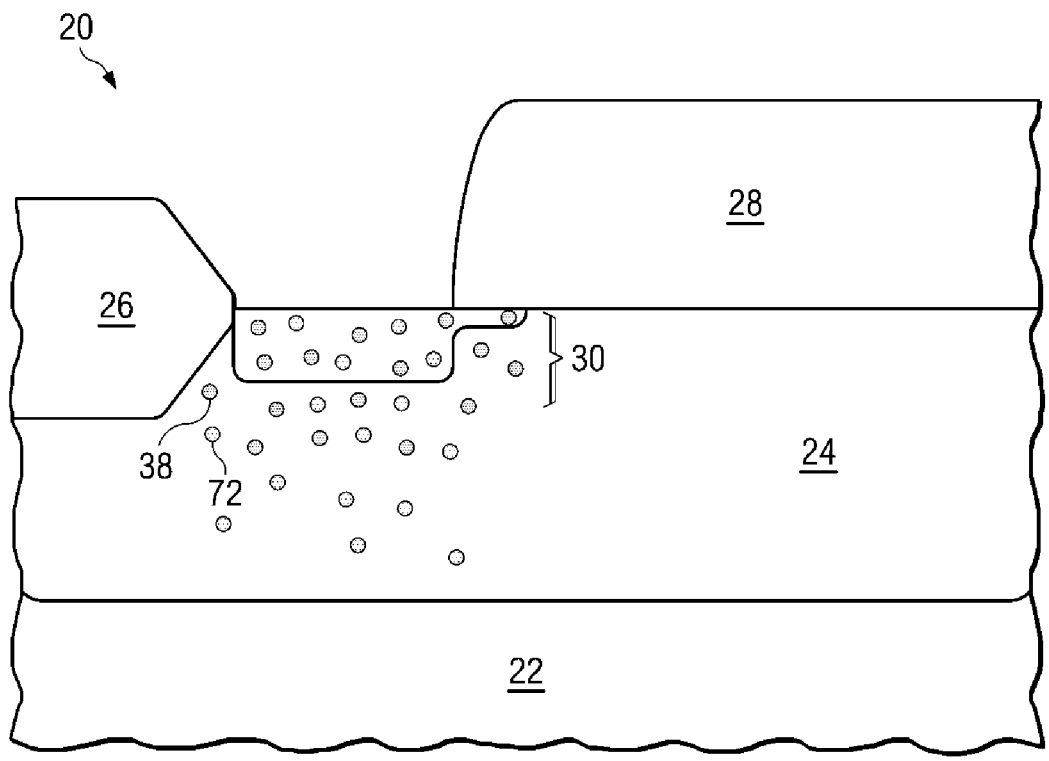
FIGS. 6A-6B are a set of side elevation views in cross-section that together illustrate a dopant configuration in accordance with the present disclosure.
Figure 6B:
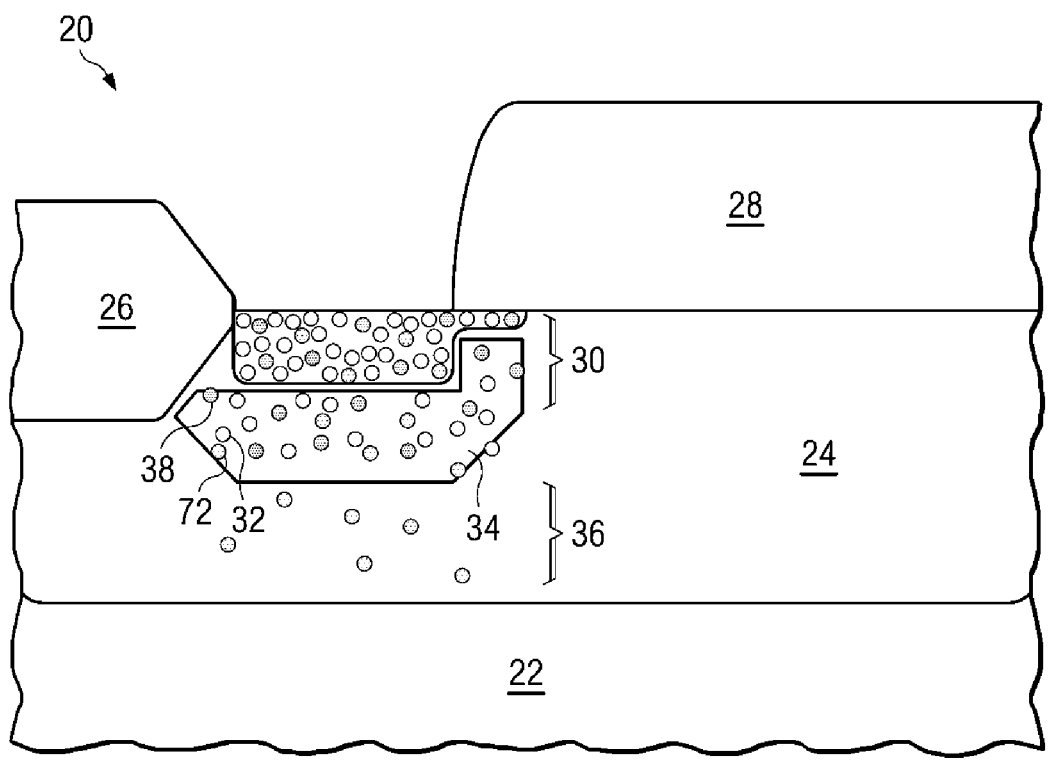

FIGS. 6A-B illustrate another embodiment in accordance with the present disclosure. These figures again illustrate a MOS semiconductor component 20 comprising (in part) a silicon wafer 22 having a semiconductor substrate 24, which may be isolated from neighboring electronically active areas via an isolation structure 26, and on which is to be formed a gate 28 bridging a target area 30 with another active area (not shown.) As discussed above, deep doping may occur when an ion enters a longitudinal channel in the crystalline silicon lattice. The channeling and concomitant deep doping may be better controlled by amorphizing the lattice, which involves introducing an agent that disrupts the physical regularity of the lattice. The agent, known as an amorphizer, ideally comprises an electronically inert species that does not affect the functionality of the semiconductor components. One such species is silicon, which may be introduced, e.g. by ion implantation, in order to impart an amorphous structure without altering the electronic properties of the circuit. It will be appreciated that persons having ordinary skill in the art may be able to select a wide array of amorphizers that are compatible with the present disclosure, and to combine them with the concepts presented herein without undue experimentation. As shown in FIG. 6A, an amorphizer 72 may be introduced in addition to carbon 38 (which may be done before, during, or after the placement of carbon 38.) This amorphizer may be introduced by any suitable method, e.g., by ion implantation. When both an amorphizer 72 and carbon 38 are present, the placement of the dopant 32 and the subsequent anneal produce a doped region as illustrated in FIG. 3B, where the placement of the dopant 32 is more tightly controlled in both the diffusion area 34 (as a result of the carbon 38) and in the channeling area 36 (as a result of the amorphizer.) Accordingly, in a set of embodiments of the method described above, the target area of the semiconductor substrate is amorphized prior to implanting the dopant. One such method of producing this amorphization is by placing silicon in the target area, and in a subset of embodiments, the silicon is placed by ion implantation of at least 10 keV and with a dosage of at least approximately $1\times10^{15}$ atoms/cm$^2$.

Figure 7:
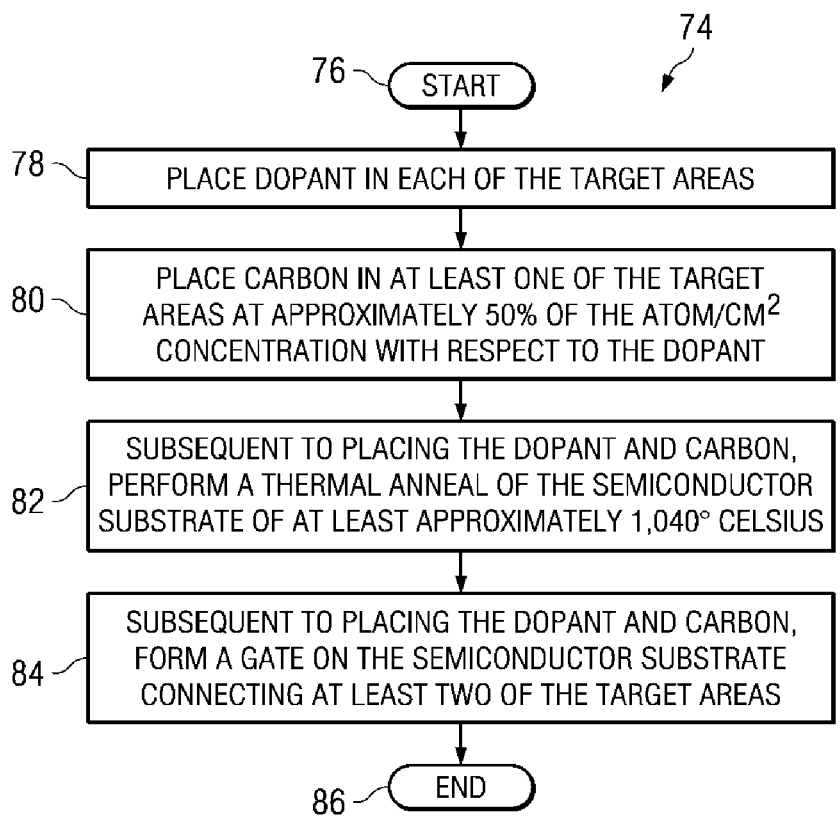
FIG. 7 is a flow diagram illustrating another exemplary method of placing a dopant in accordance with the present disclosure.

The methods described above are useful for forming a semiconductor substrate with a doped area having improved dopant activation. This technique may be utilized to form a component on a semiconductor substrate, such as a MOS transistor, having at least two electronically active target areas with a similarly improved dopant activation. One such method of forming a component on a semiconductor substrate is illustrated in FIG. 7. This method begins at 76 and calls for placing a dopant in each of the target areas 78. As discussed hereinabove, phosphorus can be used as a dopant to create an NMOS component; alternatively, boron can be used as a dopant to create a PMOS component. The method 74 continues by placing carbon in at least one of the target areas at approximately 50^ of the atom/cm$^2$ concentration with respect to the dopant 80. Once the dopant and carbon have been placed, the component may be formed by performing a thermal anneal of the semiconductor substrate of at least approximately 1,040° C. 82, which activates the dopant as discussed hereinabove, and also by forming a gate on the semiconductor substrate connecting at least two of the target areas 84. Once the gate has been formed and the anneal has been performed, the method ends at 86 with the formation of a semiconductor component having the properties described herein. It will be appreciated that the dopant and carbon may be placed in either order, or even simultaneously, and also that the anneal and gate formation may be performed in either order, or even simultaneously, while keeping within the scope of this disclosure.

Because the method of forming a semiconductor component incorporates the previously discussed method of doping a target area for improved activation, it will be appreciated that the various embodiments of the latter method may be incorporated in the former method. For example, boron may be used as a dopant to create PMOS components, or phosphorus may be used as a dopant to create NMOS components. As another example, the anneal may be performed with a laser, or with a flash lamp, or with an arc lamp. As still another example, the method of forming the semiconductor component may include the placement of an amorphizer (such as silicon) prior to the placement of the dopant via ion implantation, in order to limit the penetration of the dopant particles through the semiconductor substrate to an undesirable depth due to channeling.

Having disclosed methods and techniques in accordance with the present disclosure, it will now be appreciated that a novel semiconductor substrate may be formed having a doped area with improved activation, according to the methods and techniques discussed hereinabove. It will also be appreciated that a semiconductor component may be formed according to the methods discussed hereinabove. Such a semiconductor component will feature at least one electronically active area comprising a dopant and a carbon-containing diffusion suppressant having approximately 50% of the atom/cm$^2$ concentration with respect to the dopant, and where the dopant has been activated in the presence of the carbon-containing diffusion suppressant by a thermal anneal of at least approximately 1,040 degrees Celsius, thereby presenting the advantages of improved activation due to the thermal diffusion suppressant effect described herein.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of electronically activating a target area of a semiconductor substrate, the method comprising:
   placing a dopant in the target area;
   placing carbon in the target area at approximately 50% of the atom/cm$^2$ concentration with respect to the dopant; and
   subsequent to placing the dopant and the carbon, performing a thermal anneal of the semiconductor substrate of at least approximately 1,040 degrees Celsius.

2. The method of claim 1, where the dopant is phosphorus.

3. The method of claim 2, where the phosphorus is placed by ion implantation of at least approximately 3 keV and with a dosage of at least approximately $2\times10^{15}$ atoms/cm$^2$, and where the carbon is placed by ion implantation of at least approximately 4 keV and with a dosage of at least approximately $1\times10^{15}$ atoms/cm$^2$.

4. The method of claim 1, where the dopant is boron.

5. The method of claim 4, where the boron is placed by ion implantation of at least approximately 2 keV and with a dosage of at least approximately $2\times10^{15}$ atoms/cm$^2$, and where the carbon is placed by ion implantation of at least approximately 4 keV and with a dosage of at least approximately $1\times10^{15}$ atoms/cm$^2$.

6. The method of claim 1, where the thermal anneal is performed by heating the semiconductor substrate with a laser.

7. The method of claim 1, where the thermal anneal is performed by heating the semiconductor substrate with a flash lamp.

8. The method of claim 1, where the thermal anneal is performed by heating the semiconductor substrate with an arc lamp.

9. The method of claim 1, further comprising:
   prior to implanting the dopant, amorphizing the target area.

10. The method of claim 9, where the amorphizing comprises placing silicon in the target area.

11. The method of claim 10, where the silicon is placed by ion implantation of at least approximately 10 keV and with a dosage of at least approximately $1 \times 10^{15}$ atoms/cm$^2$.

12. A semiconductor substrate having an electronically active area formed according to the method of claim 1.

13. A method of forming a semiconductor component having at least two electronically active target areas on a semiconductor substrate, the method comprising:
   placing a dopant in each of the target areas;
   placing carbon in at least one of the target areas at approximately 50% of the atom/cm$^2$ concentration with respect to the dopant;
   subsequent to placing the dopant and the carbon, forming a gate on the semiconductor substrate connecting at least two of the target areas; and
   subsequent to placing the dopant and the carbon, performing a thermal anneal of the semiconductor substrate of at least approximately 1,040 degrees Celsius.

14. The method of claim 13, where the dopant is phosphorus.

15. The method of claim 14, where the phosphorus is placed by ion implantation of at least approximately 3 keV and with a dosage of at least approximately $2 \times 10^{15}$ atoms/cm$^2$, and where the carbon is placed by ion implantation of at least approximately 4 keV and with a dosage of at least approximately $1 \times 10^{15}$ atoms/cm$^2$.

16. The method of claim 13, where the dopant is boron.

17. The method of claim 16, where the boron is placed by ion implantation of at least approximately 2 keV and with a dosage of at least approximately $2 \times 10^{15}$ atoms/cm$^2$, and where the carbon is placed by ion implantation of at least approximately 4 keV and with a dosage of at least approximately $1 \times 10^{15}$ atoms/cm$^2$.

18. The method of claim 13, further comprising:
   prior to implanting the dopant, amorphizing the target area.

19. The method of claim 18, where the amorphizing comprises placing silicon in the target area.

20. The method of claim 19, where the silicon is placed by ion implantation of at least approximately 10 keV and with a dosage of at least approximately $1 \times 10^{15}$ atoms/cm$^2$.

* * * * *